(12) United States Patent
Honma et al.

(10) Patent No.: US 6,649,931 B2
(45) Date of Patent: Nov. 18, 2003

(54) SEMICONDUCTOR WAFER, SEMICONDUCTOR CHIP, SEMICONDUCTOR DEVICE AND METHOD FOR MANUFACTURING SEMICONDUCTOR DEVICE

(75) Inventors: Kazuki Honma, Kodaira (JP); Terutaka Okada, Musashimurayama (JP); Fumiaki Kitajima, Akita (JP); Takahiro Hatazawa, Akita (JP); Hiroyuki Motomatsu, Akishima (JP); Katsuhiro Haruyama, Akishima (JP)

(73) Assignees: Hitachi, Ltd., Tokyo (JP); Akita Electronics Co., Ltd., Akita (JP)

( * ) Notice: Subject to any disclaimer, the term of this patent is extended or adjusted under 35 U.S.C. 154(b) by 0 days.

(21) Appl. No.: 09/987,109

(22) Filed: Nov. 13, 2001

(65) Prior Publication Data

US 2002/0061606 A1 May 23, 2002

(30) Foreign Application Priority Data

Nov. 22, 2000 (JP) .................................... 2000-355658

(51) Int. Cl.$^7$ ................................................ H01L 23/58
(52) U.S. Cl. ........................................ 257/48; 257/678
(58) Field of Search ........................ 257/48, 296, 288, 257/529, 678, 679, 681, 684, 685, 777, 778

(56) References Cited

U.S. PATENT DOCUMENTS

| | | | | |
|---|---|---|---|---|
| 5,864,710 A | * | 1/1999 | Sands et al. | 364/492 |
| 5,974,499 A | * | 10/1999 | Norman et al. | 711/103 |
| 6,021,459 A | * | 2/2000 | Norman et al. | 711/5 |
| 6,107,836 A | * | 8/2000 | Kawahara et al. | 326/102 |
| 6,212,123 B1 | * | 4/2001 | Norman et al. | 365/230.3 |
| 6,366,506 B1 | * | 4/2002 | Mizumo et al. | 365/189.09 |

FOREIGN PATENT DOCUMENTS

| | | |
|---|---|---|
| JP | 06-005098 | 1/1994 |
| JP | 08-023016 | 1/1996 |

* cited by examiner

*Primary Examiner*—David Nhu
(74) *Attorney, Agent, or Firm*—Miles & Stockbridge P.C.

(57) ABSTRACT

A semiconductor device includes a first semiconductor chip having a non-volatile memory array which has a first memory area for storing input information of usual operation, and a second memory area for storing historical information of an electrical characteristic test of the first memory area. The device further includes a second semiconductor chip having a volatile memory array with a third memory area for storing input information of usual operation. Historical information of an electrical characteristic test of the third memory area of the second semiconductor chip is stored into the second memory area of the first semiconductor chip.

18 Claims, 14 Drawing Sheets

FIG. 12

| | |
|---|---|
| BIT 11 WLBI ENABLE | 0 : NORMAL<br>1 : WLBI (NEED TO BE WRITE "1") |
| BIT 10, 9 WLBI OPERATION SELECT | 00 : WLBI HISTORICAL DATA WRITE  BIT 7-4 AREA SET  BIT 3-0 DATA SET<br>01 : WLBI END  BIT 8, 6-0 IGNORE<br>10 : WLBI OPERATION<br>11 :<br><table><tr><td></td><td></td><td></td><td>b8</td><td colspan="5">HISTORICAL DATA WRITE AREA</td><td colspan="4">HISTORICAL DATA</td></tr><tr><td>1</td><td>0</td><td>0</td><td>b8</td><td>b7</td><td>*</td><td>*</td><td>*</td><td>*</td><td>*</td><td>*</td><td>*</td><td>*</td></tr><tr><td>1</td><td>0</td><td>1</td><td>*</td><td>b7</td><td>b6</td><td>b5</td><td>b4</td><td>*</td><td>*</td><td>*</td><td>*</td><td>*</td></tr><tr><td>1</td><td>1</td><td>0</td><td>*</td><td>*</td><td>*</td><td>*</td><td>*</td><td>b3</td><td>b2</td><td>b1</td><td>b0</td><td></td></tr></table> |
| BIT 8 OPTION FOR WRITING HISTORICAL DATA | 0 : OVERWRITE<br>1 : ERASE+WRITE |
| BIT 7 WLBI TRIMMING | 0 : USE FLASH FUSE DATA AS TRIMMING DATA<br>1 : USE 48 BIT LOAD DATA AS TRIMMING DATA<br>(FOLLOWING THE SETUP COMMAND, INPUT 48 BIT TRIMMING SETTING DATA.<br>INPUT 48 BIT DUMMY DATA IF NO TRIMMING) |
| BIT 6 WLBI AREA SELECT | 0 : NORMAL OPERATION AREA (32M)+OTP AREA<br>1 : ALL AREA (NORMAL, REDUNDANT X AND Y, OTP) |
| BIT 5, 4 MEMORY OPERATION SELECT (MF)<br>BIT 3, 2 MEMORY PATTERN SELECT (MP) | <table><tr><td>MP\MF</td><td>00</td><td>01</td><td>10</td><td>11</td></tr><tr><td>00</td><td colspan="4">OPEN CHECK</td></tr><tr><td>01</td><td>READ DATA OUTPUT</td><td colspan="3">READ STATUS OUTPUT</td></tr><tr><td>10</td><td colspan="4">ERASE</td></tr><tr><td>11</td><td>PROGRAM ALL "0"</td><td>PROGRAM CHECKER</td><td>PROGRAM CHECKER BAR</td><td></td></tr></table> |
| BIT 1 VERIFY (WITH OR WITHOUT) | 0 : WITH VERIFY<br>1 : WITHOUT VERIFY |
| BIT 0 SCAN METHOD (WHEN PROGRAM) | 0 : S & D : 200ns DELAY<br>1 : S & D : 2μs DELAY |

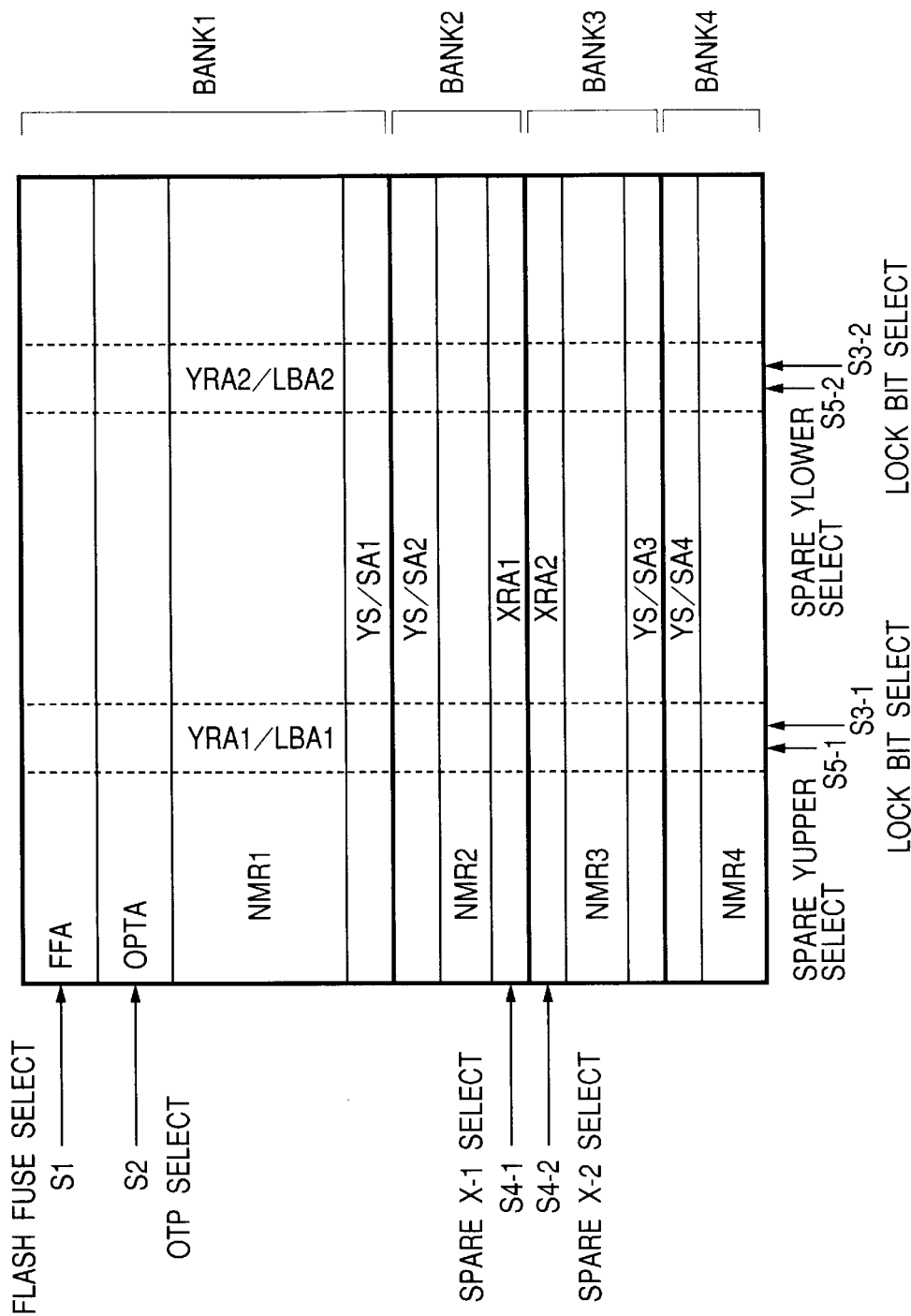

FIG. 14

| MEMORY CELL AREA | ERASE | WRITE | READ |
|---|---|---|---|
| ORDINARY MEMORY CELL AREA (NMR) | POSSIBLE | POSSIBLE | POSSIBLE |
| REDUNDANT MEMORY CELL AREA (XRA, YRA) | CONSIDERED AS ORDINARY MEMORY CELL AFTER THE REPAIR. BEFORE THE REPAIR, POSSIBLE AFTER THE INPUT OF A TEST COMMAND. | CONSIDERED AS ORDINARY MEMORY CELL AFTER THE REPAIR. BEFORE THE REPAIR, POSSIBLE AFTER THE INPUT OF A TEST COMMAND. | CONSIDERED AS ORDINARY MEMORY CELL AFTER THE REPAIR. BEFORE THE REPAIR, POSSIBLE AFTER THE INPUT OF A TEST COMMAND. |
| OTP AREA (OTPA) (ONE TIME PROGRAM) | USUALLY IMPOSSIBLE. POSSIBLE AFTER THE INPUT OF A TEST COMMAND. | POSSIBLE ONLY ONCE WITH A SPECIAL COMMAND. AFTER THE ERASE, POSSIBLE ONLY WITH A SPECIAL COMMAND. | POSSIBLE ONLY WITH A SPECIAL COMMAND. |
| FLASH FUSE AREA (FFA) | USUALLY IMPOSSIBLE. POSSIBLE AFTER THE INPUT OF A TEST COMMAND. | USUALLY IMPOSSIBLE. POSSIBLE AFTER THE INPUT OF A TEST COMMAND. | USUALLY IMPOSSIBLE. POSSIBLE AFTER THE INPUT OF A TEST COMMAND. |

FIG. 15

| MEMORY CELL AREA | IMPLEMENTATION OF BURN-IN | STORE OF BURN-IN RESULT | REMARKS |
|---|---|---|---|
| USUAL MEMORY CELL AREAZ (NMR) | IMPLEMENTATION | POSSIBLE; HOWEVER, IT IS REQUIRED TO SAVE THE HISTORICAL DATA TO A TESTER BEFORE THE NEXT TEST. | |
| REDUNDANT MEMORY CELL AREA (XRA, YRA) | AFTER THE REPAIR, IMPLEMENTED ONLY FOR RELIEVED MEMORY CELLS. BEFORE THE REPAIR, IMPLEMENTED TO ALL REDUNDANT MEMORY CELLS. | POSSIBLE; HOWEVER, IT IS REQUIRED TO SAVE THE HISTORICAL DATA TO A TESTER BEFORE THE NEXT TEST. | AFTER THE RELIEF, USUALLY CONSIDERED AS THE MEMORY CELL. BEFORE THE RELIEF, POSSIBLE AFTER THE INPUT OF A TEST COMMAND. |
| OTP AREA (OTPA) (ONE TIME PROGRAM) | IMPLEMENTATION | POSSIBLE; HOWEVER, IT IS REQUIRED TO SAVE THE HISTORICAL DATA TO A TESTER BEFORE THE NEXT TEST. | POSSIBLE WITH A SPECIAL COMMAND. |
| FLASH FUSE AREA (FFA) | NOT IMPLEMENTED. HOWEVER, POSSIBLE AFTER THE INPUT OF A TEST COMMAND. | POSSIBLE; IT IS NOT REQUIRED TO SAVE THE HISTORICAL DATA BECAUSE THE BURN-IN IS NOT EXECUTED. | ONLY WRITE OPERATION IS IMPLEMENTED FOR THE HISTORICAL DATA WITH THE OVERWRITE OPERATION. |

SEMICONDUCTOR WAFER, SEMICONDUCTOR CHIP, SEMICONDUCTOR DEVICE AND METHOD FOR MANUFACTURING SEMICONDUCTOR DEVICE

BACKGROUND OF THE INVENTION

The present invention relates to an electrical characteristic test technique for a semiconductor device and particularly to the technique that can be effectively adapted to the method of storing historical information of the burn-in test under the semiconductor wafer condition, so-called the wafer level burn-in in a semiconductor device such as MCP (Multi-Chip Package) mounting a couple of semiconductor chips, for example, a flash memory and SRAM.

FIELD OF THE INVENTION

Background Art

Following techniques have been proposed for the semiconductor device burn-in test as the technique which the inventors of the present invention have investigated. For example, the burn-in process of MCP mounting a flash memory and SRAM is generally conducted in the manner that the temperature and voltage stress exceeding the rating are applied in the testing process in which the semiconductor chips of the flash memory and SRAM are mounted on a substrate and these are electrically connected with the wire bonding method and are then molded with a resin to assemble the package structure. With this burn-in process, MCP having probability of a future fault is screened and only the good MCP is good MCP is delivered as a product.

As the technique for the pretest before the wafer test such as the burn-in test as explained above and the technique to store the wafer test result into a memory array, there are provided, for example, the techniques described in Japanese Unexamined Patent Publication Nos. HEI 8(1996)-23016 and HEI 6(1994)-5098. The technique described in the Japanese Unexamined Patent Publication No. HEI 8(1996)-23016 is proposed to store the information about good or defective products of the pretest into the redundant area of memory or to the particular area of the normal memory in order to reduce the next wafer test time. The technique described in the Japanese Unexamined Patent Publication No. HEI 6-5098 proposes the write operation of electrical characteristic during the wafer test to the redundant memory.

SUMMARY OF THE INVENTION

Here, investigation by the inventors of the present invention for the MCP burn-in technique explained above has made apparent that since the yield of the semiconductor chips of the flash memory and SRAM gives large influence on the yield of MCP after the assembling and therefore it is difficult to expect the improvement in the yield of MCP in the method of burn-in after the assembling of MCP as explained above. Namely, when this method is employed, if a fault is generated in any one of the semiconductor chips of flash memory and SRAM, the MCP assembled using these elements also becomes a fault and therefore it is thought that the yield of assembled element is deteriorated.

Therefore, the inventors of the present invention have found a method to redundantly relieve or reject semiconductor chips of defective products before the assembling by conducting the wafer level burn-in under the semiconductor wafer condition in order to improve the yield of the semiconductor chips of the flash memory and SRAM. In this case, for example, like the assembled products, each probe connected to the testing apparatus is placed in contact with each terminal of the semiconductor chip, electrical conductivity is checked between each probe in the contact condition and each terminal and thereafter the screening can be realized by executing the erase/write mode and the read mode.

However, in such wafer level burn-in, it is probable that a problem of time is generated and defective product is leaked to the assembling process because the probe test is executed to all chips including the chip found as a defective product in the burn-in test after such a wafer level burn-in test is completed. Moreover, it is also though as a problem that analysis for the cause of fault when a fault is generated in the product after the assembled products are delivered to customers.

In the techniques described in the Japanese Unexamined Patent Publication Nos. HEI 8(1996)-23016 and HEI 6(1994)-5098, the result of pretest before the wafer test and the result of the wafer test are stored in the memory array and these techniques are different from the technique for storing the historical data of the wafer level burn-in which is conducted in the semiconductor wafer condition just like the present invention.

It is therefore an object of the present invention to provide an electrical characteristic testing technique of a semiconductor device that can reduce the probe testing time, prevent leakage of defective products into an assembling process and moreover easily realize analysis of cause of generation of defective products after the delivery to customers by storing the historical data of this wafer level burn-in while the wafer level burn-in process is introduced.

The abovementioned and the other objects and novel features of the present invention will become more apparent from the description of the present specification and the accompanying drawings.

Typical inventions among those disclosed in the present specification can be briefly summarized as follows.

(1) A semiconductor wafer of the present invention mounts a plurality of semiconductor chips each of which also includes a non-volatile memory array, wherein said semiconductor chip comprises a first memory area for storing input information of usual operation and a second memory area for storing historical information of an electrical characteristic test of the first memory area. Moreover, in this semiconductor wafer, the electrical characteristic test is also adapted to the wafer level burn-in test. In addition, the second memory area may be adapted to the flash fuse area and OTP area or the lock bit area of the non-volatile memory area. Otherwise, the second memory area can be adapted to a part of the first memory area of the non-volatile memory area.

(2) The semiconductor chip of the present invention has a non-volatile memory array including a first memory area for storing an input information of usual operation and a second memory area for storing the historical information of the electrical characteristic test of the first memory area. Moreover, in the semiconductor chip, the electrical characteristic test is adapted to the wafer level burn-in test.

(3) The semiconductor device of the present invention mounts a semiconductor chip comprising a first memory area for storing input information of usual operation and a second memory area for storing historical information of an electrical characteristic test of the first memory area.

Moreover, in the semiconductor device explained above, the electrical characteristic test can be adapted to the wafer level burn-in test.

(4) The other semiconductor device of the present invention mounts a first semiconductor chip including a non-volatile memory array comprising a first memory area for storing input information of usual operation and a second memory area for storing historical information of an electrical characteristic test of the first memory area and a second semiconductor chip including a non-volatile memory array comprising a third memory area for storing an input information of usual operation, thereby for storing historical information of an electrical characteristic test of the third memory area of the second semiconductor chip in the second memory area of the first semiconductor chip. Moreover, the electrical characteristic test is adapted to the wafer level burn-in test in the other semiconductor device explained above.

(5) A method of manufacturing a semiconductor device of the present invention is adapted to a semiconductor device mounting a semiconductor chip having a non-volatile memory array cut out from a semiconductor wafer, comprising a process to conduct an electrical characteristic test of a first memory area for storing input information of usual operation of the semiconductor chip before cutting out the semiconductor chip from the semiconductor wafer and a process to store historical information of the electrical characteristic test to the second memory area of the semiconductor chip. Moreover, the electrical characteristic test in the method of manufacturing a semiconductor device may be adapted to the wafer level burn-in test. In addition, on the occasion of conducting the wafer level burn-in test, the historical information of the second memory area is temporarily saved to a testing apparatus before the wafer level burn-in test and the historical information after the wafer level burn-in test is combined with that before the burn-in test to store the combined information into the second memory area.

(6) A method of manufacturing the other semiconductor device of the present invention relates to a method of manufacturing a semiconductor device mounting a first semiconductor chip having a non-volatile memory array cut out from a semiconductor wafer and a second semiconductor chip having a volatile memory array, comprising the steps of: conducting an electrical characteristic test of the first memory area for storing input information of usual operation of the first semiconductor chip before cutting out the semiconductor chip from the semiconductor wafer; storing historical information of an electric characteristic test of the first memory area of the first semiconductor chip to the second memory area of the first semiconductor chip; conducting an electrical characteristic test of the third memory area for storing input information of usual operation of the second semiconductor chip before cutting out the semiconductor chip from the semiconductor wafer; and storing the historical information of an electrical characteristic test of the third memory area of the second semiconductor chip to the second memory area of the first semiconductor chip. Moreover, in the method of manufacturing the semiconductor device, the electrical characteristic test is adapted to the wafer level burn-in test. In addition, on the occasion of conducting the wafer level burn-in test, the historical information of the second memory area of the first semiconductor chip is temporarily saved to a testing apparatus before this burn-in test, and the historical information is combined, after this burn-in test, with that before the burn-in test and this combined historical information is stored in the second memory area of the first semiconductor chip.

BRIEF DESCRIPTION OF THE DRAWINGS

FIG. 12 is an explanatory diagram showing a setup command in the wafer level burn-in mode in the preferred embodiment of the present invention.

FIG. 13 is a structural diagram showing a detail of the memory array in the preferred embodiment of the present invention.

FIG. 14 is an explanatory diagram showing a relationship among the usual memory area, redundant memory area, OTP area, erase operation, write operation and read operation for the flash fuse area in the preferred embodiment of the present invention.

FIG. 15 is an explanatory diagram showing a relationship among the usual memory area, redundant memory area, OTP area, implementation of burn-in test for the flash fuse area and storing area of burn-in test result assumed as the historical data of the electrical characteristic test.

DESCRIPTION OF THE PREFERRED EMBODIMENT

The preferred embodiment of the present invention will be explained in detail with reference to the accompanying drawings thereof.

Figure 1:
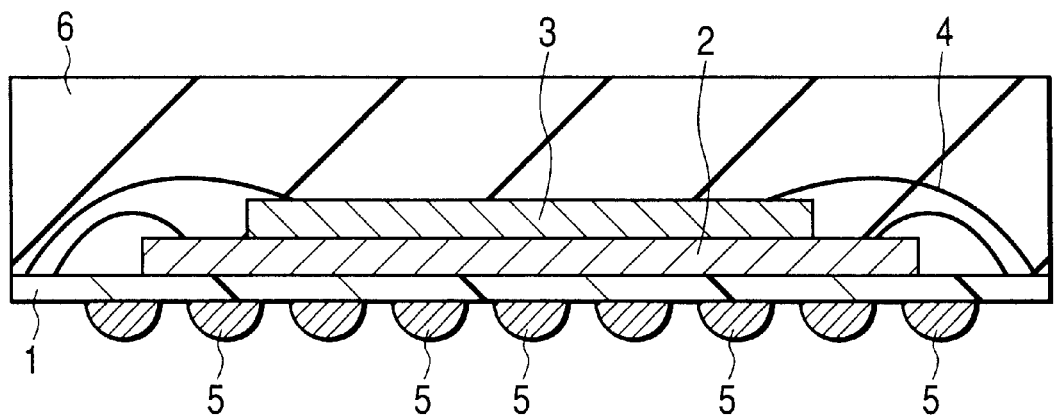
FIG. 1 is a cross-sectional view showing a semiconductor device as a preferred embodiment of the present invention.

First, a structure of an example of the semiconductor device of the preferred embodiment will be explained with reference to FIG. 1. FIG. 1 is a cross-sectional view showing a semiconductor device.

The semiconductor device of this embodiment is defined as an MCP (Multi-Chip Package) mounting a couple of semiconductor chips of a flash memory, for example, as electrically programmable and erasable non-volatile memory and SRAM (Static type Random Access Memory) and is composed of a substrate 1, a semiconductor chip 2 of flash memory as a non-volatile memory mounted on this substrate 1, a semiconductor chip 3 of RAM as a non-volatile memory mounted on the semiconductor chip 2 of this flash memory, a wire 4 connecting the terminals of the semiconductor chips 2, 3 and terminals on the substrate 1, a solder ball 5 electrically connected to the terminals on the substrate 1 via the wiring pattern and through hole to become an external terminal arranged on the rear surface of this substrate 1 and a resin 6 for molding the semiconductor chips 2, 3 and wire 4. This MCP is not restricted only to such structure and is also not restricted to the mounting of the flash memory and SRAM.

The substrate 1 is composed, for example, of a resin substrate of the multi-layer structure, a ceramic substrate or a tape substrate, wherein a metal pad as an electrode terminal formed, for example, of gold (Au) is provided on the front surface, a metal land as an electrode terminal formed of Au or the like is provided on the rear surface and the metal pad on the front surface is electrically connected with the metal land at the rear surface via the through hole among respective layers and the wiring pattern of each layer.

The semiconductor chip 2 of flash memory is provided with the metal pad formed of Au or the like at the front surface and also forms therein the predetermined integrated circuit such as a non-volatile EEPROM (Electrically Erasable and Programmable Read Only Memory) and each terminal of the integrated circuit within this chip is electrically connected up to the metal pad on the front surface of chip. The semiconductor chip 2 of this flash memory is mounted on the front surface of substrate 1 at the rear surface side thereof and the metal pad on the semiconductor chip 2 is electrically connected to the metal pad on the front surface of the substrate 1 with the wire 4.

The semiconductor chip 3 of SRAM is provided, at the surface thereof, with a metal pad formed of Au and forms therein the predetermined integrated circuit of volatile SRAM. Each terminal of the internal integrated circuit is electrically connected up to the metal pad at the surface. The rear surface side of the semiconductor chip 3 of this SRAM is mounted on the surface of the semiconductor chip 2 of flash memory and the metal pad on the surface of semiconductor chip 3 is electrically connected to the metal pad on the surface of substrate 1 with the wire 4.

The wire 4 is formed, for example, of a metal wire of Au and this wire 4 electrically connects the metal pad at the surface of the semiconductor chips 2, 3 and the metal pad at the surface of the substrate 1.

The solder ball 5 is formed as a ball, for example, of lead (Pb)/Sn (Tin) or a metal material not including lead. This solder ball 5 is joined with the metal land on the rear surface of the substrate 1 and is arranged, for example, in the form of an array on the rear surface of the substrate 1.

The resin 6 is composed, for example, of an epoxy-based resin material having insulation property and this resin 6 seals the surface of substrate 1 covering the semiconductor chips 2, 3 and wire 4.

The MCP structured as explained above electrically connects up to the solder ball 5 joined with the metal land of this substrate 1 from each terminal of the semiconductor chip 2 of flash memory and the integrated circuit of the semiconductor chip 3 of SRAM via the metal pad and wire 4 on the surfaces of the semiconductor chips 2, 3, metal pad on the surface of substrate 1, through hole of each layer, wiring pattern of each layer and metal land on the rear surface of the substrate 1.

Figure 2:
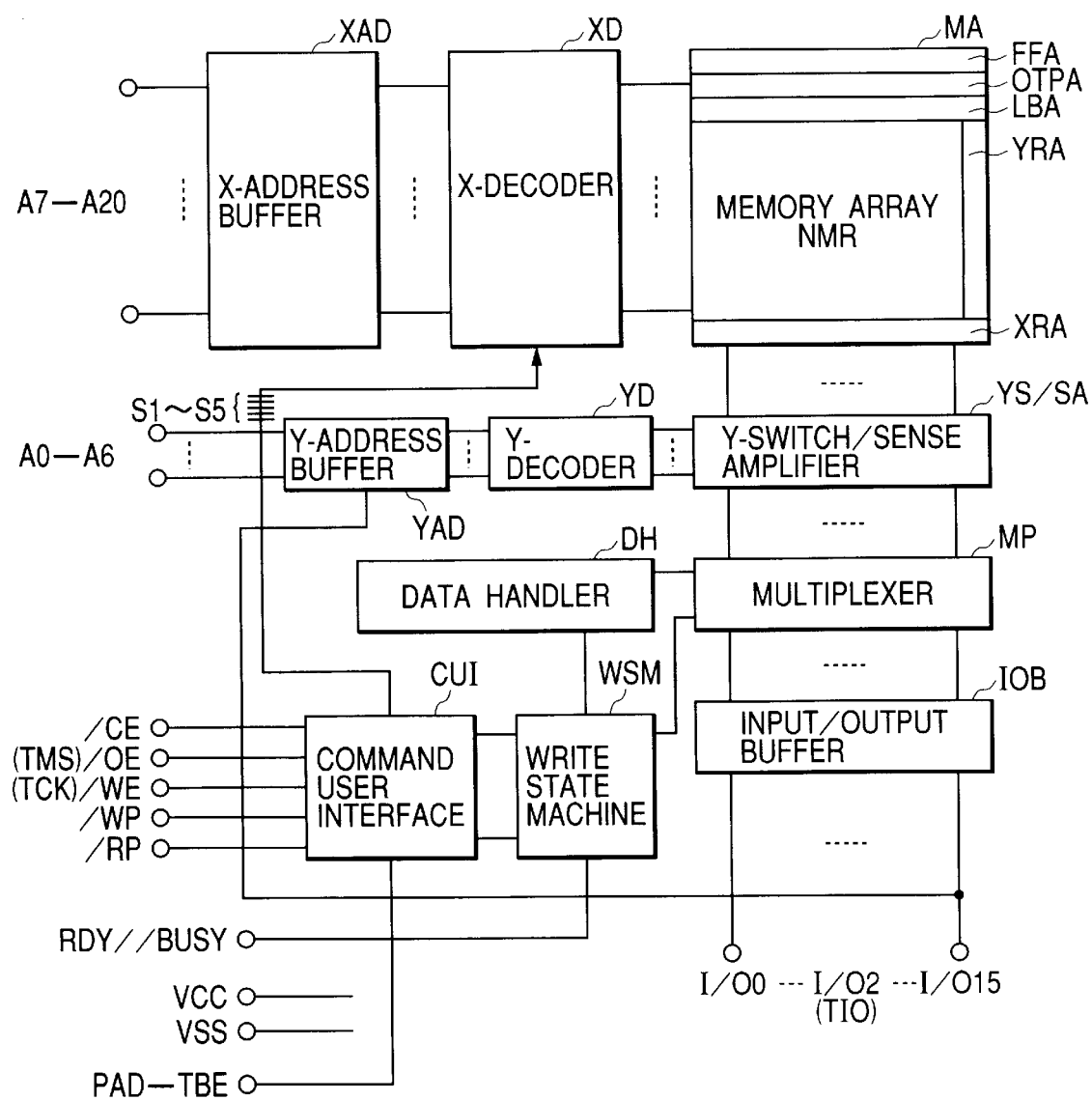
FIG. 2 is a block diagram showing a semiconductor chip of the flash memory in the preferred embodiment of the present invention.

Next, with reference to FIG. 13 and FIG. 14, an example of structure of a semiconductor chip of the flash memory will be explained based on the FIG. 2. FIG. 2 is a block diagram showing the semiconductor chip of the flash memory, while FIG. 13 is structural diagram showing the detail of the memory array and FIG. 14 is an explanatory diagram showing relationship among the erase operation, write operation and read operation to the memory cell area.

The semiconductor chip 2 of flash memory is composed of a memory array MA in which a plurality of memory cells are arranged like a lattice, X-system X-address buffer XAB and X-decoder XD for selecting the desired memory cells within this memory array MA, Y-axis Y-address buffer YAB and Y-decoder YD, a Y-switch/sense amplifier YS/SA for inputting and outputting data for the selected memory cells, a multiplexer MP, an input/output buffer IOB, a command user interface CUI for generating the sequence of erase/write, read mode, a write state machine WSM and a data handler DH or the like. As shown in the figure, the memory array MA includes an ordinary memory cell area NMR, a flash fuse area FFA, an OTP area OTPA, a lock bit area LBA, an X-redundant memory cell area XRA and a Y-redundant memory cell area YRA. The areas FFA, OTPA, LBA, XRA and YRA can be selected with the commands formed through combination of the predetermined signals to be inputted to a command user interface CUI. This CUI sets selectively only one signal among the selection signals S1 to S5 to the enable state to uniquely select the areas FFA, OTPA, LBA, XRA and YRA.

In this semiconductor chip 2 of the flash memory, the address signals A7 to A20 are inputted to the X-address buffer XAB as the external address signal and the address signals A0 to A6 to the Y-address buffer YAB, respectively. Moreover, as the control signals, a chip enable signal/CE, an output enable signal/OE, a write enable signal/WE and a write protect signal/WP, a reset/power-down signal/RP are respectively inputted to the command user interface CUI and a ready/busy signal RDY//BUSY is outputted from the write state machine WSM. Moreover, the input/output data I/O0 to I/O15 are inputted and outputted via the input/output buffer IOB. In addition, the power supply voltage VCC and reference voltage VSS are also supplied from the external circuits.

As the basic operations of the semiconductor chip 2 of the flash memory, the X-direction address within the memory cell area NMR of the memory array MA is designated with the X-address buffer XAB and X-decoder XD based on the externally inputted address signals A7 to A20, while the Y-direction address is designated with the Y-address buffer YAB and Y-decoder YD based on the address signals A0 to A6, in order to select the memory cells allocated at the intersecting points of the word line and bit line based on the designated addresses. With the erase/write operations for these selected memory cells, the input/output data I/O0 to I/O15 are inputted to the memory cells as the erase/write data via the input/output buffer IOB. Moreover, in the read operation, the read data from the memory cell is outputted to the input/output data I/O0 to I/O15 through the input/output buffer IOB after it is sensed and amplified with the Y-switch/sense amplifier YS/SA.

In this case, the erase/write, read and moreover test mode are determined with the command user interface CUI based on the chip enable signal/CE, output enable signal/OE, write enable signal/WE, write protect signal/WP and reset/power-down signal/RP, the sequence of each mode is generated with the write state machine WSM based on this determined mode and execution of erase/write mode, read mode and test mode is controlled based on this sequence.

Moreover, although explained later in detail, in the semiconductor chip 2 of flash memory, the pad of the input/output data I/O2 of the usual operation mode is used in common with the input/output serial data TIO, the pad of the write enable signal/WE with the burn-in reference clock signal TCK and the pad of the output enable signal/OE with the mode set signal TMS in the wafer level burn-in mode. Therefore, only the pad of the burn-in enable signal TBE is provided exclusively. In addition, the power supply voltage VCC, reference voltage VSS are also used in common with the pad of the usual operation mode.

FIG. 13 shows a further detail structure of the memory array MA of FIG. 2. The memory array MA is divided into four banks BANK1 to BANK4. These banks BANK1 to BANK4 are structured to enable the read operation of the other bank, for example, of the bank BANK2 in parallel with the write (programming) operation of one bank, for example, the bank BANK1.

The bank BANK1 includes the flash fuse area FFA, OTP area OTPA, usual memory cell area NMR1 and Y-switch/sense amplifier YS/SA1. The bank BANK2 includes the usual memory cell area NMR2, Y-switch/sense amplifier YS/SA2 and x-redundant memory cell area XRA1. The bank BANK3 includes the usual memory cell area NMR3, Y-switch/sense amplifier YS/SA3 and X-redundant memory cell area XRA2. The bank BANK4 includes the usual memory cell area NMR4 and Y-switch/sense amplifier YS/SA4.

The X-redundant memory cell area XRA1 may be used, for example, as the X-direction memory cells of the banks BANK1 and BANK2. Similarly, the X-redundant memory cell region XRA2 may be used, for example, as the X-direction spare memory cells of the banks BANK3 and BANK4. Here, the X-direction is assumed as the word line direction and the X-redundant memory cell areas XRA1, XRA2 are formed for repair in unit of the word line.

As can be understood from FIG. 13, the Y-redundant memory cell area YRA and lock bit area LBA are provided respectively, in the Y direction of each bank, with division into two areas of the Y-redundant memory cell area/lock bit area YRA1/LBA1 and the Y-redundant memory cell area/lock bit area YRA2/LBA2. The Y-redundant memory cell areas YRA1 and YRA2 are structured for repair in unit of the data line.

As explained with reference to FIG. 2, the flash fuse area FFA and OTP area OTPA may be selected respectively with the selection signal S1 (FLASH fuse Select) and S2 (OPT Select) from the command user interface CUI. The X-redundant memory cell area XRA1 and X-redundant memory cell area XRA2 are respectively selected with the selection signals S4-1 (Spare X-1 Select) and S4-2 (Spare X-2 Select) from the command user interface CUI. The Y-redundant memory cell areas YRA1 and YRA2 are respectively selected with the selection signals S5-1 (Spare Yupper Select) and S5-2 (Spare Ylower Select) from the command user interface CUI and the lock bit areas LBA1 and LBA2 are respectively selected with the selection signals S3-1 (Lock bit Select) and S3-2 (Lock bit Select) from the command user interface CUI. Namely, for the areas FFA, OPTA, XRA1, XRA2, YRA1, YRA2, LBA1 and LBA2, the erase of memory cells, write and read processes are enabled within these areas with the selection signals from the command user interface CUI.

FIG. 14 shows a relationship among the erase operation, write operation and read operation for the usual memory area (NMR), redundant memory area (XRA, YRA), OTP area (OTPA) and flash fuse area (FFA).

In the usual memory area (NMR), the erase operation, write operation and read operation are all enabled.

The redundant area (XRA, YRA) are considered as the usual memory cell after implementation of repair of the defective memory cell and the erase operation, write operation and read operation are all enabled in this area. However, before the repair of the defective memory cell, the erase, write and read operations are enabled in the redundant area (XRA, YRA) under the condition that the predetermined command such as the test command is inputted to the command user interface CUI.

In the OTP area (OTPA), the erase operation under the usual condition is disabled but such erase operation is enabled under the condition that the predetermined command such as the test command is inputted to the command user interface CUI. In the OTP area (OTPA), the write operation is enabled only once under the condition that the special command is inputted to the command user interface CUI. Moreover, when the memory cells in the OTP area (OPTA) are erased, the write operation is enabled under the condition that the special command is inputted to the command user interface CUI. In addition, the read operation from the OTP area (OTPA) is enabled under the condition that the special command is inputted to the command user interface CUI.

On the other hand, the erase, write and read operations for the memory cells in the flash fuse area (FFA) are disabled in the usual condition. However, these operations for the memory cells in the flash fuse area (FFA) are enabled only under the condition that the predetermined command such as the test command is inputted to the command user interface CUI.

As explained above, the redundant area (XRA, YRA) OTP area (OTPA) and flash fuse area (FFA) may be used as explained later as the historical data storing area of burn-in process by providing thereto a certain kind of limitation for access.

Figure 3:
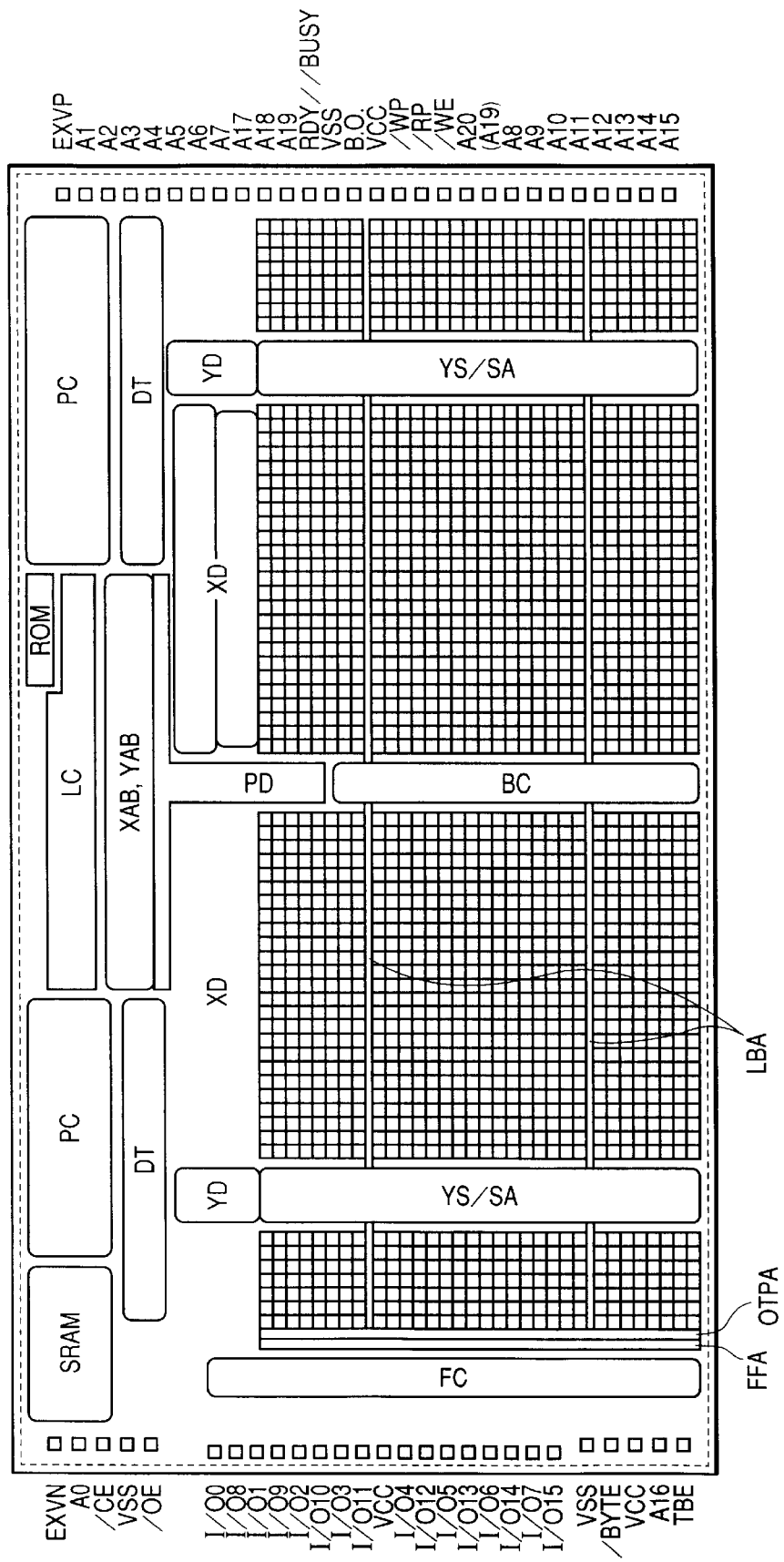
FIG. 3 is a layout showing the semiconductor chip of the flash memory in the preferred embodiment of the present invention.

Next, referring to FIG. 15, a layout of an example of the semiconductor chip of flash memory will be explained based on FIG. 3. FIG. 3 is a layout diagram showing the semiconductor chip of flash memory. FIG. 15 is an explanatory diagram showing a relationship between implementation of the burn-in test to the memory cell area and storing area of the burn-in test result.

In FIG. 3, the memory array MA of semiconductor chip 2 of flash memory is divided into two sections of right and left sections and in the right and left sections, respective sections are further divided sandwiching the Y-switch/sense amplifier YS/SA. Between the memory arrays MA divided into the right and left sides, a boost circuit BC is arranged and a predecoder PD is allocated at the upper side thereof. Moreover, at the upper side of the divided memory arrays MA, an X-decoder XD is allocated and at the upper side of the Y-switch/sense amplifier YS/YA, a Y-decoder YD is allocated. Moreover, at the upper side of the X-decoder XD and Y-decoder YD, the circuits such as X-address buffer XAB, Y-address buffer YAB, logic circuit LC, pump circuit PC, distributor DT, read-only memory ROM and static random access memory SRAM or the like are allocated. In the logic circuit LC, the circuits such as command user interface CUI, write state machine WSM and data handler DH or the like are included. Moreover, in the left side of the memory array MA, a fuse controller FC is allocated.

In addition, moreover, the pads for the control signals such as externally inputted address signals A0 to A20, chip enable signal/CE, output enable signal/OE, write enable signal/WE, write protect signal/WP, reset/power-down signal/RP and ready/busy signal RDY//BUSY, input/output data I/O0 to I/O15, power supply voltage VCC and reference voltage VSS are allocated in the right and left peripheral areas of the semiconductor chip 2 of the flash memory.

Particularly, in this embodiment, as shown in FIG. 2, the OTP (One Time Programmable) area OTPA, flash fuse area FFA and lock bit area LBA are provided, in addition to the memory cell area NMR for writing an input information of usual operation, within the memory array MA and the historical data of the electrical characteristic test can be written into these areas. The OPT area OPTA allows the programming only once and is provided as the area for mainly writing the intrinsic information such as the manufacturing information of makers. The flash fuse area FFA is provided as the area for writing the redundant address/enable information for redundant repair by changing over the defective bits of usual area for storing an input information of the usual operation into the redundant repair bit. The lock bit area LBA is used to write the setting information to prohibit the erase/write operations in unit block. Among these areas, the OTP area OTPA and lock bit area LBA are provided to conduct the burn-in test like the usual area during the burn-in operation, while the flash fuse area FFA is provided as the area where the burn-in test is not carried out.

FIG. 15 shows a relationship between implementation of the burn-in test for the usual memory area (NMR), redundant memory area (XRA, YRA), OTP area (OTPA) and flash fuse area (FFA) and the storing area of the burn-in test as the historical data of the electrical characteristic test.

In the usual memory area (NMR), OTP area (OTPA) the burn-in test is executed. In the redundant memory area (XRA, YRA), the burn-in test is conducted only for the memory cells used for repair after the defective memory cells are repaired, but before the defective memory cells are repaired, the burn-in test is conducted for all memory cells. The burn-in test is not conducted to the flash fuse area (FFA) but the burn-in test can also be implemented under the condition that the predetermined command such as the test command is inputted to the command user interface CUI.

The burn-in test result can be stored for all areas of the usual memory area (NMR), redundant memory area (XRA, YRA), OTP area (OTPA) and flash fuse area (FFA) However, as is explained in regard to FIG. 15, it is desired that the historical data stored in respective areas such as the usual memory area (NMR), redundant memory area (XRA, YRA) and OTP area (OTPA) are saved to the external apparatus such as a tester before the next burn-in test and other testing. When the burn-in test is not implemented for the flash fuse area (FFA), it is not required to save the historical data to be stored in the area.

Figure 4:
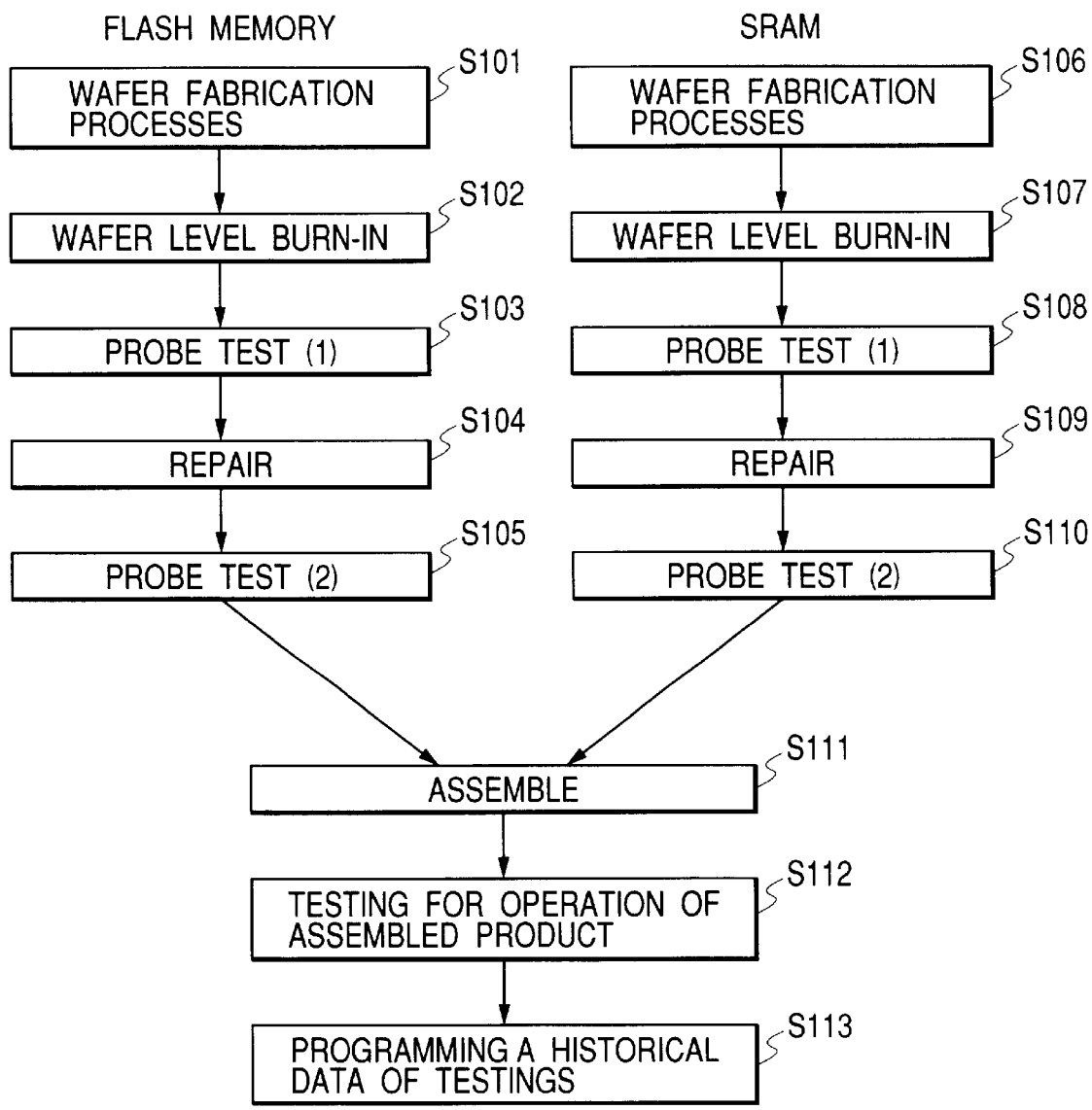
FIG. 4 is a flowchart showing a method of manufacture up to the assembling process from the wafer process of the semiconductor device in the preferred embodiment of the present invention.
Figure 5:
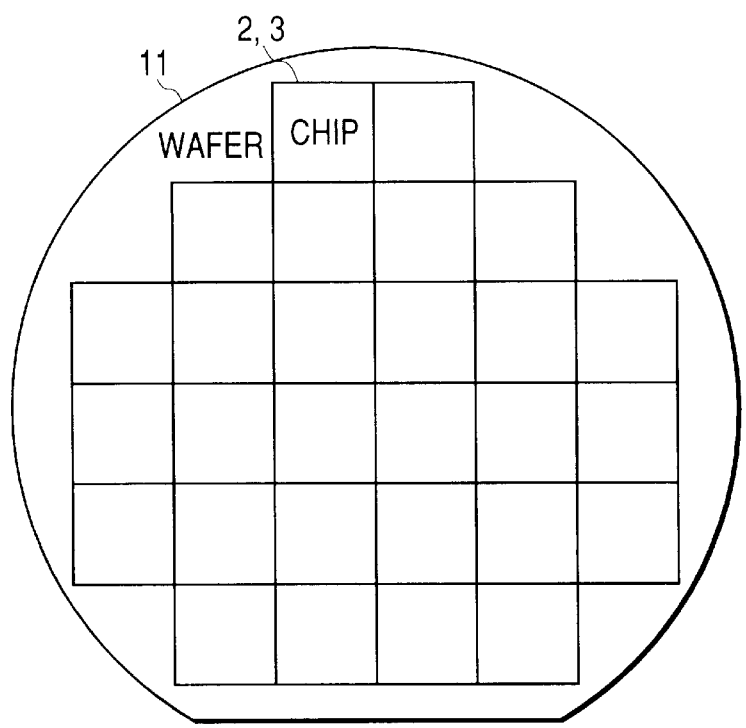
FIG. 5 is a plan view showing the semiconductor wafer condition in the preferred embodiment of the present invention.
Figure 6:
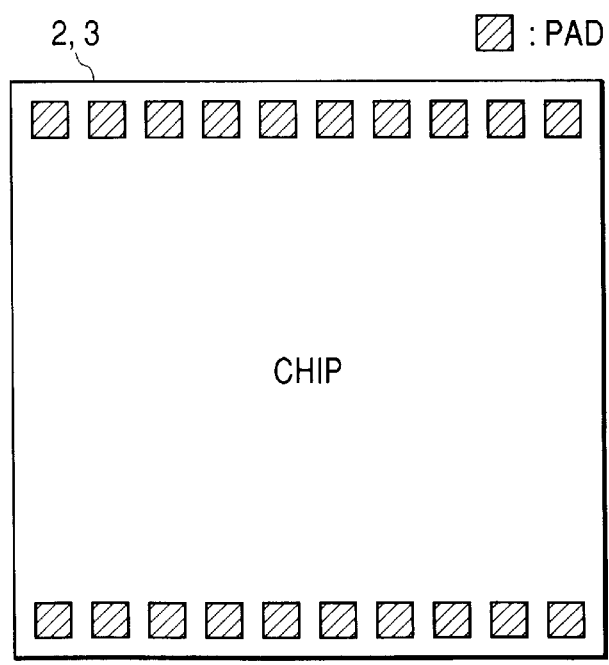
FIG. 6 is a plan view showing the semiconductor chip condition in the preferred embodiment of the present invention.

Next, referring to FIG. 5 and FIG. 6, an example of the method of manufacturing MCP up to the assembling process from the wafer process, in which the semiconductor chip of flash memory and semiconductor chip of SRAM are mounted, will be explained based on FIG. 4. FIG. 4 is a flowchart showing the method of manufacturing MCP up to the assembling process from the wafer process. FIG. 5 is a plan view showing the semiconductor wafer condition and FIG. 6 is a plan view showing the semiconductor chip condition.

First, in regard to the semiconductor chip 2 of flash memory, the wafer processes such as oxidation/diffusion/implantation of impurities, formation of wiring patterns, formation of insulation layers and formation of wiring layers are repeatedly conducted to form the predetermined integrated circuit in the pre-process of the semiconductor wafer (step S101), thereafter the wafer level burn-in is conducted in this semiconductor wafer condition (step S102), the semiconductor chip 2 which will generate a fault in future is identified and the repair is executed, as explained later, in the repair process for such semiconductor chip 2. The wafer level burn-in test result is written into the semiconductor chip 2 of flash memory. Details of this wafer level burn-in test will be explained later.

Thereafter, the wafer level burn-in test result is read to conduct the probe test (1) for the semiconductor chip of good product (step S103). This probe test (1) includes a function test to check whether the predetermined functions are attained or not by testing the memory function using the predetermined test pattern with the erase/write and read operations, for example, for the flash memory, the DC test such as the open/short inspection between the input and output pads, leak current inspection and measurement of power supply current and the AC test such as testing of the AC timing of the memory control. The result of this probe test (1) is written into the semiconductor chip 2 of flash memory.

For the semiconductor chip 2 of defective product, a defective bit is found by reading the result of probe test (1) and then analyzing the test result and the repair is conducted by executing the redundant repair process to this defective bit with the redundant repair circuit (step S104). In this repair process, the repair is also conducted in the same manner for the semiconductor chip 2 which as been identified as the defective chip in the burn-in test.

Moreover, it is confirmed that the defective bit is converted to the bit for redundant repair with the redundant repair process by conducting again the probe test (2) of semiconductor chip 2 after the repair (step S105). The result of this probe test (2) is written into the semiconductor chip 2 of the flash memory. Thereby, in regard to the semiconductor chip 2 of flash memory, the pre-process in the stage of semiconductor wafer is completed, and thereby the semiconductor wafer mounting a plurality of semiconductor chips 2 of flash memory having completed the burn-in test can be generated.

In the same manner, also in regard to the semiconductor chip 3 of SRAM, the semiconductor wafer mounting a plurality of semiconductor chips 3 of SRAM having completed the burn-in test can be generated by conducting, in the pre-process of the semiconductor wafer, the wafer level burn-in (step S107), probe test (1) (step S108), repair (step S109) and probe test (2) (step S110) after forming the predetermined integrated circuit by repeating the wafer processes.

Subsequently, the results of the probe tests (1), (2) are read and the MCP is assembled using the semiconductor chip 2 of flash memory of good product and the semiconductor chip 3 of SRAM (step S111). First, as explained above, the semiconductor wafer of the flash memory and semiconductor wafer of SRAM having completed the pre-process of semiconductor wafer are cut to separate each semiconductor chip as explained above and thereby the semiconductor chip 2 of flash memory and semiconductor chip 3 of SRAM isolated for each semiconductor chip are prepared.

For example, as an example, the flat structure is attained as shown in FIG. 5 in the condition of semiconductor wafer 11 or as shown in FIG. 6 in the condition of the cut-out semiconductor chips 2, 3. However, in FIG. 5 and FIG. 6, the number of semiconductor chips 2, 3 mounted on the semiconductor wafer 11 and the number of pads provided in the semiconductor chips 2, 3 are set to the values less than the actual values. For example, the semiconductor chips 2, 3 are set to 540 as an example, while the pads to 50 as an example. In these semiconductor chips 2, 3, the pads are allocated in the two sides of the peripheral area, but it is of course possible to introduce various changes or modifications, for example, the semiconductor chips are allocated in the peripheral four sides or along the center line.

Thereafter, the die-bonding for mounting the semiconductor chip 2 of flash memory and semiconductor chip 3 of SRAM on the substrate 1, wire bonding for connecting the pads of these semiconductor chips 2, 3 and the pad on the substrate 1 with a wire 4, resin mold for molding the semiconductor chips 2, 3 and wire 4 with resin 6 to protect these elements and lead formation to form an external lead and conduct the surface process are executed. Thereby, the assembling process of MCP of the package structure is completed to provide the structure of cross-section as shown in FIG. 1 explained above.

Moreover, the operation test of MCP having completed the assembling process is conducted (step S112). In this operation test, like the probe test, for example, of the semiconductor chips 2, 3, the function test for confirming whether the predetermined function can be attained or not by testing the memory function using the predetermined test pattern with the erase/write and read operation for the flash memory and SRAM, the DC test such as open/short inspection among the input/output pads, leak current inspection and measurement of power supply current and the AC test for testing the AC timing of the memory control of flash memory and SRAM are conducted.

Finally, as a result of operation test of MCP, the historical data of MCP operation test and the historical data of wafer level burn-in and probe test of the semiconductor chip 3 of SRAM are written to the semiconductor chip 2 of flash memory only in the MCP of good products (step S113). The historical data of the wafer level burn-in and probe test of the semiconductor chip 2 of flash memory is already written into the semiconductor chip 2 of the flash memory. Only the MCPs to which this historical data is written are delivered as the good products. Depending on the result of this operation test of MCP, MCP is assembled by combining the flash memory having completed the burn-in test and the semiconductor chips 2, 3 of SRAM, the burn-in process in the assembling process is no longer required and the yield of operation test of the assembled product can be raised.

Figure 7:
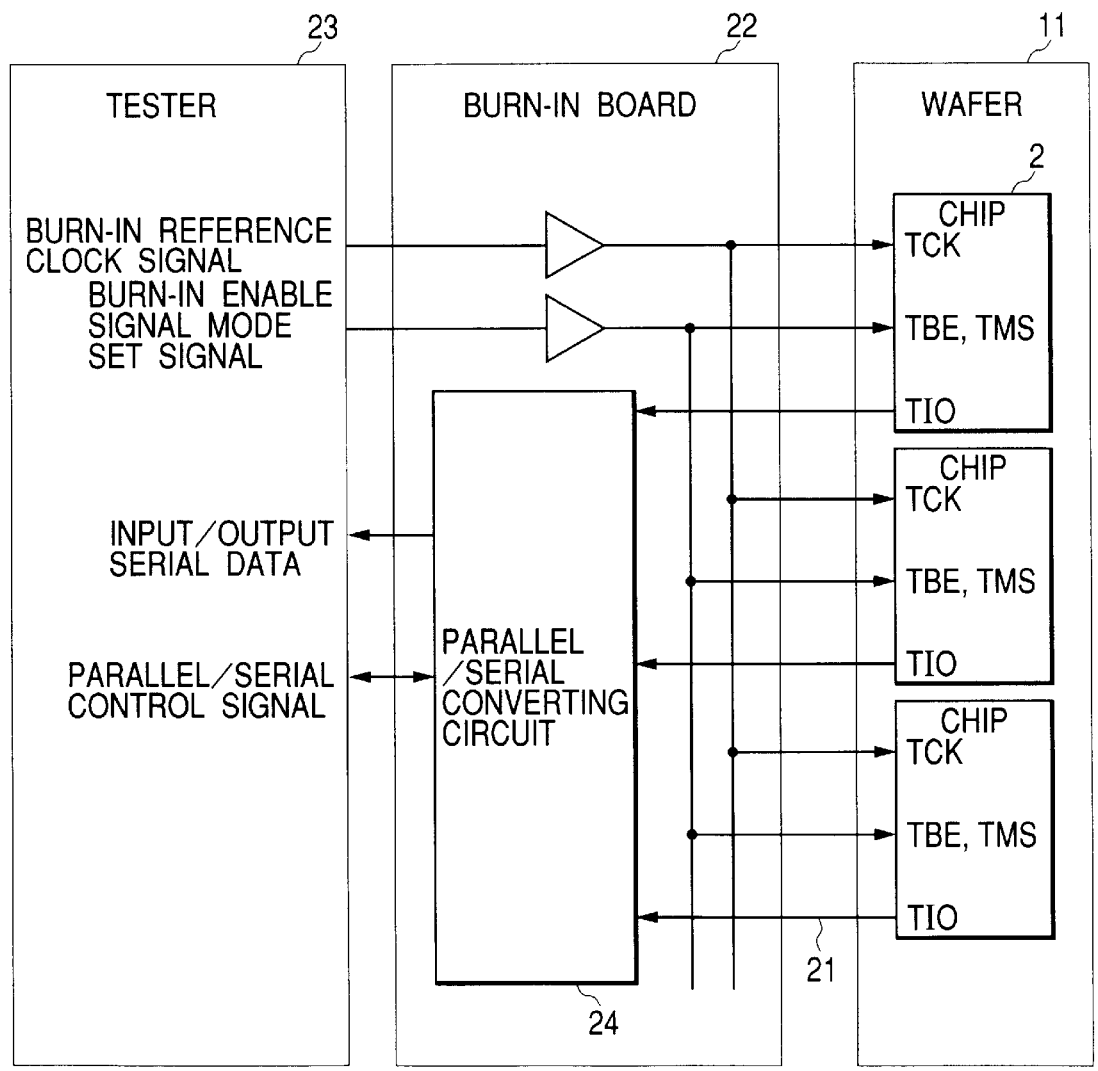
FIG. 7 is a block diagram showing a test system to realize the wafer level burn-in test in the preferred embodiment of the present invention.

Next, with reference to FIG. 7, an example of the test system to realize the wafer level burn-in of the semiconductor chip of flash memory will be explained. FIG. 7 is a block diagram showing the test system to realize the wafer level burn-in.

The test system is composed of a semiconductor wafer 11 mounting a plurality of semiconductor chips 2 of flash memory as explained above, a burn-in board 22 to conduct the burn-in by placing the probe 21 in contact with the pad of each semiconductor chip 2 of this semiconductor wafer 11 and a testing apparatus 23 for inputting and outputting various signals such as a burn-in reference signal for burn-in, a burn-in enable signal, a mode set signal and an input/output serial data. The burn-in board 22 is also provided with a parallel/serial converting circuit 24 to output the parallel data of input/output data outputted from each semiconductor chip 2 to the testing apparatus 23 through conversion to the serial dada. The test system to realize the wafer level burn-in of the semiconductor chip 1 of SRAM is also formed in the similar structure.

In this testing system, the burn-in reference clock signal, burn-in enable signal and mode set signal generated from the testing apparatus 23 are supplied to each semiconductor chip 2 of the semiconductor wafer 11 via each buffer of the burn-in board 22. Moreover, the input/output data outputted from each semiconductor chip 2 is converted to the serial data from the parallel data in the parallel/serial converting circuit 24 in the burn-in board 22 and is then fetched with the testing apparatus 23. The testing apparatus 23 and the parallel/serial converting circuit 24 of burn-in board 22 are controlled with the parallel/serial control signal.

Figure 8:
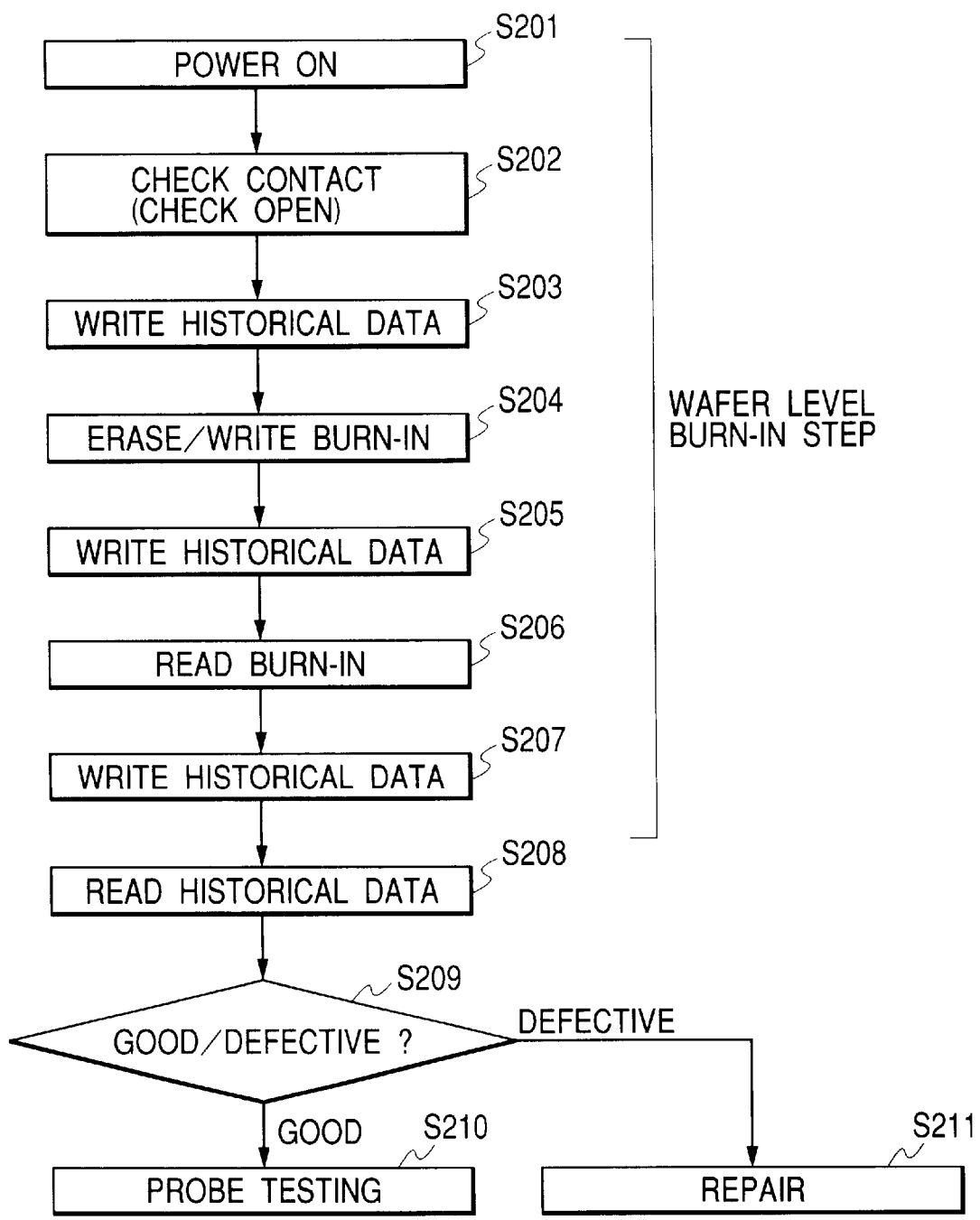
FIG. 8 is a flowchart showing the wafer level burn-in test of the flash memory in the preferred embodiment of the present invention.

Next, an example of the wafer level burn-in of the semiconductor chip of flash memory will be explained in detail with reference to FIG. 8. FIG. 8 is the flowchart showing the wafer level burn-in of the flash memory.

The wafer level burn-in is a testing method for testing at a time the semiconductor chips 2 of all flash memories under the condition of semiconductor wafer 11 completed in the preceding process.

(1) In the wafer level burn-in process, the probe 21 of the burn-in board 22 is placed in contact with the pad of the semiconductor chip 2 of each flash memory of the semiconductor wafer 11 and the power supply (VCC/VSS) is supplied at a time to each semiconductor chip 2 (step S201).

(2) Subsequently, the contact check (open/short) is executed for the input/output pad of each semiconductor chip 2 (step S202) and the historical data of contact check is written into the conductive semiconductor chip 2 (step S203). In this case, the historical data is not written into the non-conductive semiconductor chip 2 in the contact failure condition and this semiconductor chip 2 is processed as the defective product.

In this case, when the area for writing the historical data to the rewrite areas for erase/write operations such as the OTP area OTPA and lock bit area LBA is set within the memory array MA explained above, the information is read, for example, with the testing apparatus to temporarily save the historical data before starting the burn-in test and the data obtained by combining the historical data before the rewrite test and the historical data after this rewrite test is rewritten into the semiconductor chip 2.

Moreover, if the area for writing the historical data, for example, is different from the rewrite area for the erase/write operation like the flash fuse area FFA, the erase/write mode is implemented in direct to the rewrite area for erase/write operation and the historical data after this test can be written into the semiconductor chip 2.

(3) Next, the erase/write mode (rewrite test) is implanted as the burn-in test to the memory array MA of each semiconductor chip 2 (step S204) and the historical data (pass/fail) of the burn-in result of this erase/write mode is written into the semiconductor chip 2 like the historical data of the contact check (step S205).

(4) Subsequently, the read mode similar to that for the usual memory is implemented to the memory array MA of each semiconductor chip 2 (step S206) as the burn-in and the historical data (pass/fail) of the burn-in result of this read mode is written into the semiconductor chip 2 just like the historical data explained above (step S207). The wafer level burn-in process is thereby finished.

(5) In the probe test process following the wafer level burn-in process, the historical data written in the wafer level burn-in process is read first (step S208) to determine whether the relevant chip is good product (pass) or defective product (fail) (step S209). The probe test is continuously executed only to the good semiconductor chip 2 (step S210). The historical data of this probe test is also written to the semiconductor chip 2. Here, the repair process is executed to the defective semiconductor chip 2 (step S211).

As explained above, the testing time can be shortened by writing the historical data of the electrical characteristic test of the contact check, erase/write mode and read mode because it is enough, for example, when the wafer level burn-in test is shifted to the probe test, to continue only the test of the semiconductor chip 2 as the good product by reading the historical data of the preceding test at the time of starting the next test.

Figure 9:
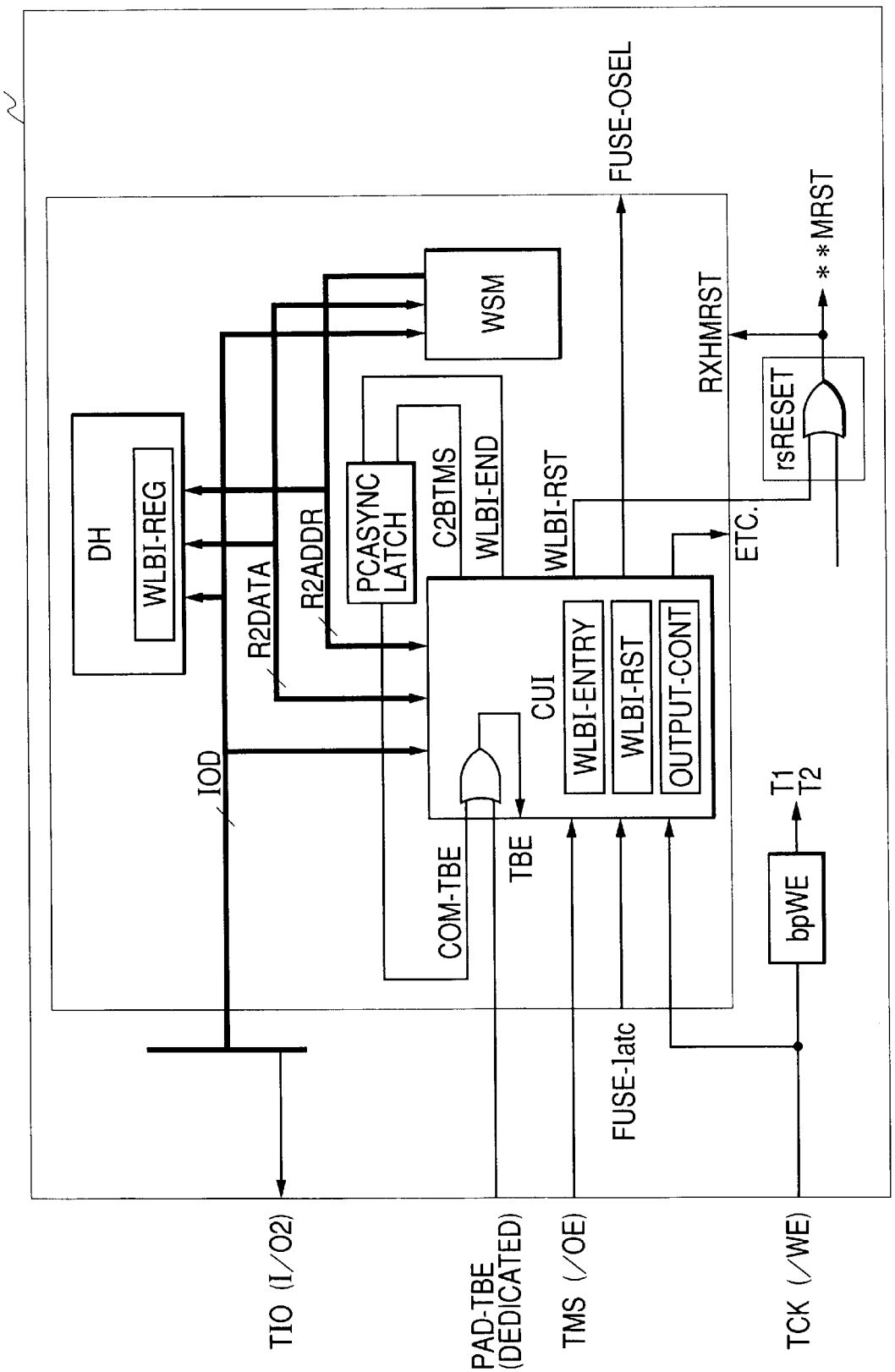
FIG. 9 is a block diagram showing a circuit including the wafer level burn-in function of the flash memory in the preferred embodiment of the present invention.
Figure 10:
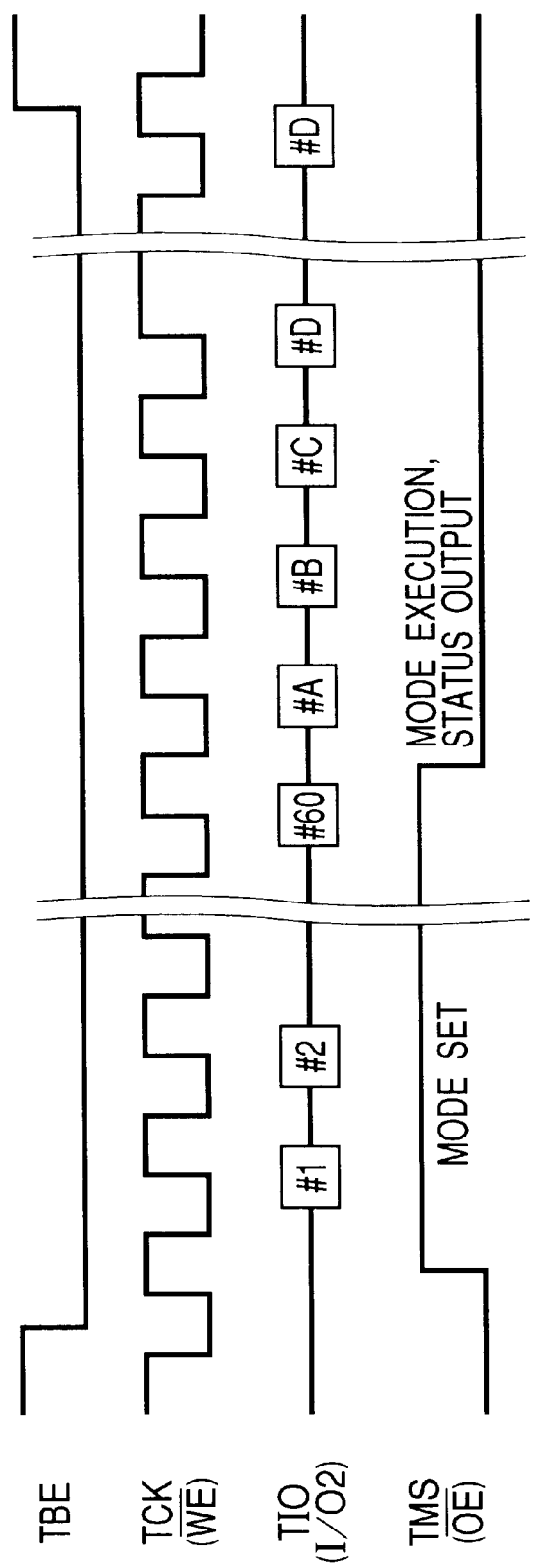
FIG. 10 is a timing chart showing the wafer level burn-in mode in the preferred embodiment of the present invention.
Figure 11:
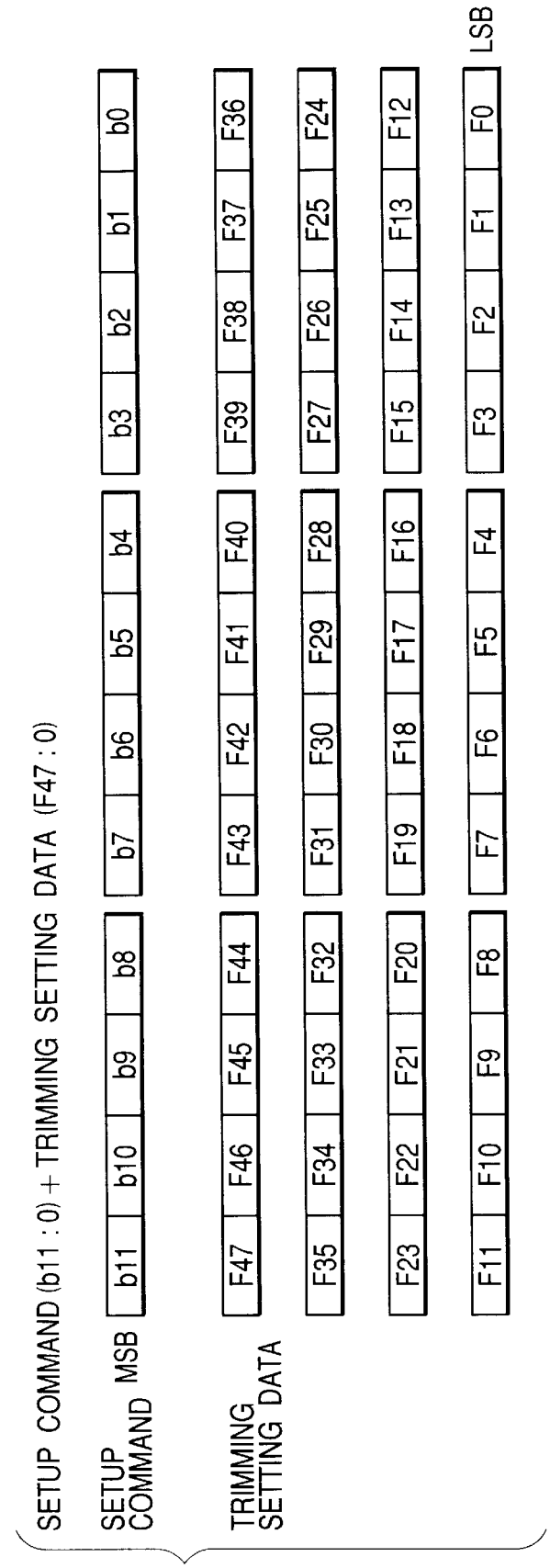
FIG. 11 is an explanatory diagram showing a data format in the wafer level burn-in mode in the preferred embodiment of the present invention.

Next, an example of the wafer level burn-in mode will be explained in detail with reference to FIG. 9 to FIG. 12. FIG. 9 is a block diagram showing the circuit including the wafer level burn-in function of flash memory. FIG. 10 is a timing chart showing the wafer level burn-in mode. FIG. 11 is an explanatory diagram showing a data format of the wafer level burn-in mode. FIG. 12 is an explanatory diagram showing a setup command of the wafer level burn-in mode.

As shown in FIG. 9, the circuit including the wafer level burn-in function of flash memory is formed of the command user interface CUI included in the logic circuit LC, write state machine WSM and data handler DH or the like and these area connected with each other via the address bus R2ADDR, data bus R2DATA and control signal bus IOD. The wafer level burn-in mode is implemented using the input/output signals for the semiconductor chip 2 of flash memory such as input/output serial data TIO, burn-in reference clock signal TCK, burn-in enable signal TBE, mode set signal TMS, power supply voltage VCC and reference voltage VSS.

For example, the pad of the input/output serial data TIO is used in common with the input/output data of usual operation mode I/O2, the pad of the burn-in reference clock signal TCK with the write enable signal/WE, the pad of the mode set signal TMS with the output enable signal/OE and moreover only the pad of the burn-in enable signal TBE is provided exclusively. The pads of the power supply voltage VCC and reference voltage VSS are identical to that of the usual operation mode. Each signal of these wafer level modes has the function explained below.

(1) The burn-in enable signal TBE is controlled with an input from the exclusive pin for the wafer level burn-in or issuance of evaluation command (WLBI-MODE-SET) from the test mode. When the evaluation command is issued for entry to the wafer level burn-in, the wafer level burn-in is completed by issuing the WLBI-END command and thereby the burn-in mode is returned to the usual test mode. For example, the wafer level burn-in mode does not start when TBE is in the "H" level but starts when TBE is in the "L" level. It is because a selector opens to accept the wafer level burn-in command when the signal PAD-TBE enters the command user interface CUI.

(2) The mode set signal TMS changes while the burn-in reference clock signal TCK is in the "H" level (TCK="H"). When the burn-in enable signal TBE is in the "L" level, the mode set signal TMS becomes "H" to switch the mode. Namely, the signal TMS is the mode signal to become the command input condition when it is in the "H" level and to execute the operation when it is in the "L" level (TBE="L" and AND). However, if all commands are not inputted (60 times), the wafer level burn-in is not executed even in the "L" condition.

(3) The burn-in reference clock signal TCK is the reference signal for the wafer level burn-in and sequentially fetches (12 bits) the input condition of the input/output serial data TIO while the TCK rises to the command register of the command user interface CUI when burn-in enable signal TBE is in the "L" (TBE="L") level and the mode set signal TMS is in the "H" level (TMS="H").

(4) The input/output serial data TIO switches the input and output with the mode set signal TMS (input: #1 to #60, output: #A to #D).

The command user interface CUI comprises the circuit blocks WLBI-ENTRY, WLBI-RST and OUTPUT-CONT or the like to receive as the inputs signals the burn-in reference clock signal TCK, burn-in enable signal TBE (PAD-TBE) and mode set signal TMS from the external circuits and the FUSE-latch signal and COM-TBE signal from the internal circuit and output the C2BTMS signal, WLBI-END signal, WLBI-RST signal and FUSE-OSEL signal or the like. Moreover, this command user interface CUI also receives as the input signals the data of the address bus R2ADDR, data bus R2DATA and control signal bus IOD.

The write state machine WSM is connected to the address bus R2ADDR, data bus R2DATA and control signal bus IOD to receive as the input signals the data of the address bus R2ADD and data bus R2DATA to output the data to the control signal bus IOD. This write state machine WSM is connected to the memory array MA from the multiplexer MP explained above.

The data handler DH includes the circuit block WLBI-REG and is connected to the address bus R2ADDR, data bus R2DATA and the control signal bus IOD to receive as the input signals the data of the address bus R2ADDR, data bus R2DATA and control signal bus IOD. This data handler DH is also connected to the multiplexer MP as explained above. Each circuit block within these command user interface CUI and data handler DH has the function explained below.

(1) The circuit block WLBI-ENTRY sets the wafer level burn-in mode. This circuit fetches the 12-bit serial data (setup command) inputted as the input/output serial data TIO and the subsequent 48-bit serial data (trimming setup data) to reflect these signals to the register after the serial/parallel conversion. The command user interface CUI recognizes the mode by reading the register immediately after it is driven.

(2) The circuit block WLBI-RST generates a reset signal for wafer level burn-in enable (TBE="L"). After the burn-in enable signal TBE falls, this reset signal becomes the "H" pulse signal during the period until the next burn-in reference clock signal TCK rises from fall of the burn-in enable signal TBE. This signal WLBI-RST is ORed with the master reset in the block rsRESET.

(3) The circuit block OUTPUT-CONT continuously inputs the clocks T1 and T2 because the write enable signal/WE becomes the burn-in reference clock signal TCK during the wafer level burn-in. In this case, this circuit block controls the clock input as many times as required, internally controls the command data and generates the required control signal during the wafer level burn-in.

(4) The circuit block WLBI-REG executes the control to output in serial the wafer level burn-in condition from the pad of the input/output serial data TIO. During the read operation (data output), the usual memory data is outputted from the pad of input/output serial data TIO through the parallel/serial conversion, while during the erase/program mode, the resister data is outputted and during the other cases, the data of circuit WLBI-REG is outputted.

In the flash memory including the wafer level burn-in function as explained above, a command of the CHIP-ERASE mode is generated within the command user interface CUI is generated for the erase mode, while a command of the Write Buffer to Flash mode for the program mode and thereby the signal Busy is generated in the write state machine WSM for the driving purpose. Thereby, the write state machine WSM sequentially checks the 12 bits of the command register, establishes the necessary setting and then executes the erase program sequence.

The data handler DH is a latch circuit for outputting the condition of the wafer level burn-in as the input/output serial data TIO and outputs, by receiving the condition of the command register of the command user interface CUI, the status set in the data handler DH during the contact check, or the read status during the read mode, or the erase status during the erase mode, or the program status during the program mode, or no data therefrom only during the read data output but an output data from the memory cell as the input/output serial data TIO. This input/output serial data TIO is outputted when the burn-in reference clock signal TCK falls while the mode set signal TMS is in the "L" level and the burn-in enable signal TBE is in the "L" level.

For example, as the setting of the write data during the program mode, the data of 256 bits are set to the all "0" to write the 2048 bits (data transfer to 256 bits×16 bit lines). Of the 4096 bits of the data line, 2048 bits are written in every other bit and the data in which "0" and "1" are inverted can be written to the adjacent word lines by setting the address transition to the next word line+1 bit line. During the erase mode, this ease mode is executed by setting the verify data (expected value) to all "1" for the simultaneous erase of block. Only during the write mode of historical data, the desired data of 4 bits can be set to bit 3 to 0.

In regard to determination of with/without verify, when the defective bit is repaired, the usual sequence is completed in the result of with verify, but if the program/erase is executed under the condition the defective bits are left, the verify of the defective bit cannot pass the check and the test is completed in this stage. Therefore, the setting of with/without verify must be conducted to apply the stress to all bits.

Moreover, in regard to the scanning method (skip & domino•program system), it is effective only in the program mode and the bit lines are usually selected with shift in unit of 200 ns when there is no defective bit to realize the write mode of 2048 bits. This write operation is based on the balance between the write current of memory cell and the current generated in the internal voltage generating circuit. Therefore, since 10 bits are selected simultaneously during the write operation of one bit, if a fault of one bit exists, a current is leaked therefrom in a certain case. Accordingly, the next bit is selected with shift in unit of 2 μs which is the time required for write mode.

As shown in FIG. 10, in the wafer level burn-in mode, after the burn-in enable signal TBE is shifted to "L" from "H", the mode set can be executed by shifting the mode set signal TMS to "H" from "L" and while the mode set signal TMS is in the "H" level, the rewrite data can be inputted to the memory cell as the input/output serial data TIO in synchronization with the burn-in reference clock signal TCK. Moreover, execution of the wafer level burn-in mode and output of status can be executed by shifting the mode set signal TMS to "L" from "H" while the burn-in enable signal TBE is kept at "L" level and while the mode set signal TMS is in the "L" level, the read data and status of the memory cell can be outputted as the input/output serial data TIO in synchronization with the burn-in reference clock signal TCK.

As shown in FIG. 11, the wafer level burn-in mode can be set by serially inputting the information of 60 bits consisting of the setup command formed of 12 bits (b11 to b0) and sequential trimming set data of 48 bits (F47 to F0) as the input/output serial data TIO. In this case, the input data is inputted in synchronization wit the burn-in reference clock signal TCK.

As shown in FIG. 12, the bit 11 of the wafer level burn-in (WLBI) mode setup command indicates the wafer level burn-in enable, bits 10, 9 indicate selection of the wafer level burn-in operation, bit 8 indicates the historical data write option, bit 7 indicates the wafer level burn-in trimming, bit 6 indicates selection of wafer level burn-in area, bits 5, 4 indicate selection of memory operation (MF), bit 3, 2 indicate selection of memory pattern (MP), bit 1 indicates with/without verify and bit 0 indicates scanning method (during program mode), respectively.

(1) In the wafer level burn-in enable of bit 11, the bit "0" designates the normal operation and bit "1" designates the wafer level burn-in operation.

(2) In the selection of wafer level burn-in operation with the bits 10, 9, the bits "0, 0" designate the operation to write the historical data of wafer level burn-in and the bits 7 to 4 designate the area set and the bits 3 to 0 designates the data set. Moreover, the bits "0, 1" designate the end of wafer level burn-in and the bits 8, 6 to 0 are neglected. Moreover, the bits "1, 0" designate the wafer level burn-in operation and the bits 7 to 0 are set freely.

(3) In the historical data write option of bit 8, the bit "0" designates the over-write operation and the bit "1" designates combination of erase and write operations.

(4) In the wafer level burn-in trimming of bit 7, the bit "0" designates use of the flash fuse data as the trimming data and the bit "1" designates use of the 48-bit load data as the trimming data. In this case, the trimming set data of 48 bits is inputted following the mode setup command. In the case of no trimming, the dummy of 48 bits is inputted. For example, during the wafer level burn-in operation, the bit is set to "1".

(5) In the selection of wafer level burn-in area of bit 6, the bit "0" selects the usual operation area (32M) and OTP area, while the bit "1" selects the all areas, namely the usual operation area, redundant repair X, Y area and OTP area. For example, for the wafer level burn-in operation, the bit is set to "1". These redundant repair X, Y areas are particular X area and Y area for repairing the defective bits of the usual operation area, while the OTP area is the particular area enabling only once the data write operation.

(6) In the selection of memory operation (MF) of bits 5, 4 and selection of memory pattern (MP) of memory pattern of bits 3, 2, the bits "0, 0, 0 or 1, 0 or 1" designate the open check, the bits "0, 1, 0, 0 or 1" designate the read data output, the bits "0, 1, 1, 0 or 1" designate the read status output, the bits "1, 0, 0 or 1, 0 or 1" designate the erase, the bits "1, 1, 0, 0" designate the program all 0, the bits "1, 1, 0, 1" designate the program checker, the bits "1, 1, 1, 0" designate the checker bar in which the program checker is inverted. For example, on the occasion of wafer level burn-in operation, the bits are set to "0, 0, 0, 1" for the contact check, the bits are set to "1, 0, 0, 1" and "1, 1, 0, 1" for the erase/write mode and the bits are set to "0, 1, 0, 1" for the read mode, respectively.

(7) In the with/without verify of the bit 1, the bit "1" designates with verify, while the bit "0" designates without verify. Usually, if the target level will not probably be attained even with the retry, the bit is set to "1". For example, in the case of the wafer level burn-in operation, the bit is set to "1".

(8) In the scanning method (during the program mode) with the bit 0, the bit "0" designates the scanning in the delay of 200 ns with the skip (S) & domino (d) and the bit "1" designates the scanning in the delay of 2 μm with the skip & domino. This skip & domino means the scanning method in which the scanning is conducted while the desired number of bits are skipped. For example, the bit is set to "1" for the wafer level burn-in operation.

As explained above, the wafer level burn-in test can be executed by setting the wafer level burn-in mode in the flash memory including the wafer level burn-in function.

Therefore, according to the profile of this embodiment, since it is enough to continue the test of only the semiconductor chip 2 of the good product after reading the historical data of wafer level burn-in at the time of next test such as the probe test by writing and storing the historical data of wafer level burn-in to the area where the information before the wafer level burn-in of the semiconductor chip 2 of flash memory is not erased, the time required by the next test can be shortened and thereby the screening cost can also be lowered. Moreover, even in the case where the historical data is written and stored to the area where the information is eased in the wafer level burn-in test, the time required by the next test can be shortened and the screening cost can also be lowered in the same manner by temporarily saving the data before the burn-in test to the testing apparatus 23 and then writing back the combined data to the semiconductor chip 2 after the burn-in test.

Moreover, since only the semiconductor chip 2 of good product can be sent to the assembling process after checking the historical data in the assembling process by storing the historical data of the wafer level burn-in test and probe test in the semiconductor chip 2 of flash memory, sending of a defective product to the assembling process can be prevented easily and thereby the reliability of semiconductor chip 2 can then be improved.

Moreover, even in the MCP in which the semiconductor chip 2 of flash memory and semiconductor chip 3 of SRAM are sealed, the historical data of the wafer level burn-in test, probe test and operation test of MCP in the semiconductor chip 2 of flash memory stored in the semiconductor chip 2 of flash memory and the semiconductor chip 3 of SRAM can be checked easily when a fault is generated in the customer side, a fault analysis of a product can be conducted easily.

The present invention has been practically explained based on the preferred embodiment thereof but the present invention is not restricted to the preferred embodiment and may be of course changed and modified within the scope of the claims thereof.

For example, in the preferred embodiment, an example of MCP mounting two semiconductor chips of flash memory and SRAM has been explained but it is also possible to introduce various changes and modifications for the structure of assembling parts such as the combination of a non-volatile flash memory and a volatile memory such as RAM, DRAM or SDRAM and a combination of non-volatile memories and combination of three or more memories. Therefore, the present invention can be widely adapted to almost all kinds of semiconductor devices in which at least non-volatile flash memory is loaded.

Moreover, it is enough for the semiconductor chip of semiconductor wafer to have the structure including the non-volatile memory area for storing the historical data of the wafer level burn-in test.

The effects of the typical inventions of the present invention disclosed in this specification are as follows.

(1) Since it is enough for the next electrical characteristic test such as the probe test to additionally continue the test of only the semiconductor chip of a good product in the historical information of the preceding electrical characteristic test by writing and storing, to the semiconductor chip of non-volatile memory, the historical information of the electrical characteristic test such as the wafer level burn-in test. Thereby, the test time of the electrical characteristic test can be shortened and accordingly the screening cost of the semiconductor chip can also be lowered.

(2) Since only the semiconductor chip having the historical information proving the good product can be sent in the assembling process by storing the historical information of the electrical characteristic test such as the wafer level burn-in test and probe test into the semiconductor chip of non-volatile memory, leak of defective product into the assembling process can be prevented easily and thereby the reliability of the semiconductor chip and the semiconductor device loading the same semiconductor chip can be so far improved.

(3) In a semiconductor device mounting only a semiconductor chip of a non-volatile memory or mounting a semiconductor chip of non-volatile memory and a semiconductor chip of volatile memory, if a fault in the customer side is generated after delivery to the customer, the historical information stored in the semiconductor chip of non-volatile memory can be checked easily. Therefore, the cause of a fault generated in the semiconductor device can be analyzed easily.

(4) According to the items (1) to (3), in the case where a semiconductor chip of the non-volatile memory is delivered as a product or in the case where a semiconductor device mounting only the semiconductor chip of non-volatile memory or the semiconductor chip of non-volatile memory and the semiconductor chip of volatile memory is delivered as a product, cost can be lowered and reliability of the product can be improved through reduction of the screening time.

What is claimed is:

1. A semiconductor wafer comprising:
a plurality of semiconductor chips, each of which includes a non-volatile memory array, and
wherein said non-volatile memory array of each said semiconductor chip comprises:
a first memory area for storing input information of usual operation;
a second memory area for storing historical information of an electric characteristic test of said first memory area; and
a third memory area for storing historical information of an electric characteristic test of a volatile memory chip.

2. A semiconductor wafer according to claim 1, wherein said electrical characteristic test is a wafer level burn-in test.

3. A semiconductor wafer according to claim 2, wherein said second memory area is a flash fuse area of said non-volatile memory array.

4. A semiconductor wafer according to claim 2, wherein said second memory area is an OTP area of said non-volatile memory array.

5. A semiconductor wafer according to claim 2, wherein said second memory area is a lock bit area of said non-volatile memory array.

6. A semiconductor wafer according to claim 2, wherein said second memory area is a part of said first memory area of said non-volatile memory array.

7. A semiconductor chip including a non-volatile memory array, said non-volatile memory array comprising:
- a first memory area for storing input information of usual operation;
- a second memory area for storing historical information of an electrical characteristic test of said first memory area; and
- a third memory area for storing historical information of an electrical characteristic test of a volatile memory chip.

8. A semiconductor chip according to claim 7, wherein said electrical characteristic test is a wafer level burn-in test.

9. A semiconductor device mounting a semiconductor chip including a non-volatile memory array, said non-volatile memory array comprising:
- a first memory area for storing input information of usual operation;
- a second memory area for storing historical information of an electrical characteristic test of said first memory area; and
- a third memory area for storing historical information of an electrical characteristic test of a volatile memory chip.

10. A semiconductor device according to claim 9, wherein said electrical characteristic test is a wafer level burn-in test.

11. A semiconductor device comprising:
- a first semiconductor chip including a non-volatile memory array comprising:
  - a first memory area for storing input information of usual operation, and
  - a second memory area for storing historical information of an electrical characteristic test of said first memory area; and
- a second semiconductor chip including a volatile memory array comprising a third memory area for storing input information of usual operation,
- wherein historical information of an electrical characteristic test of said third memory area of said second semiconductor chip is stored into said second memory area of said first semiconductor chip.

12. A semiconductor device according to claim 11, wherein said electrical characteristic test is a wafer level burn-in test.

13. A semiconductor chip comprising:
- a non-volatile memory having a first memory area for input information of usual operation, and a second memory area for historic information of an electrical characteristic test of a volatile memory chip.

14. A semiconductor chip according to claim 13, wherein said electrical characteristic test is a wafer level burn-in test.

15. A semiconductor device comprising:
- a semiconductor chip including a non-volatile memory having a first memory area for input information of usual operation, and a second memory area for historic information of an electrical characteristic test; and
- a semiconductor chip having a volatile memory,
- wherein said second memory area of said non-volatile memory stores information of an electrical characteristic test of said volatile memory.

16. A semiconductor device according to claim 15, wherein said electrical characteristic test is a wafer level burn-in test.

17. A semiconductor device according to claim 15, wherein said non-volatile memory stores historic information of an electrical characteristic test of said first memory area thereof.

18. A semiconductor device according to claim 15, wherein each of said non-volatile memory and said volatile memory comprises an array of memory cells.

* * * * *